US008789384B2

(12) United States Patent  
Eckberg et al.

(10) Patent No.: US 8,789,384 B2  
(45) Date of Patent: Jul. 29, 2014

(54) COMPUTER RACK COOLING USING INDEPENDENTLY-CONTROLLED FLOW OF COOLANTS THROUGH A DUAL-SECTION HEAT EXCHANGER

(75) Inventors: Eric A. Eckberg, Rochester, MN (US); Vinod Kamath, Raleigh, NC (US); Howard V. Mahaney, Jr., Cedar Park, TX (US); William M. Megarity, Roxboro, NC (US); Mark E. Steinke, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 968 days.

(21) Appl. No.: 12/729,859

(22) Filed: Mar. 23, 2010

(65) Prior Publication Data

US 2011/0232889 A1    Sep. 29, 2011

(51) Int. Cl.
*F25B 27/00* (2006.01)
*F25B 7/00* (2006.01)
*F25D 23/12* (2006.01)
*F28D 15/00* (2006.01)
*H05K 7/20* (2006.01)

(52) U.S. Cl.
USPC ...... 62/259.2; 62/238.1; 62/335; 165/104.33; 165/80.2; 165/80.3; 361/688; 361/689; 361/696; 361/701

(58) Field of Classification Search
USPC .................. 62/238.1, 259.2, 335; 165/104.33, 165/80.2–80.5; 361/688, 689, 696, 701; 454/184
See application file for complete search history.

(56) References Cited

U.S. PATENT DOCUMENTS

| | | | | |
|---|---|---|---|---|
| 4,535,386 | A  * | 8/1985 | Frey et al. | 361/714 |
| 4,567,733 | A  * | 2/1986 | Mecozzi | 62/175 |
| 6,164,369 | A | 12/2000 | Stoller | |
| 6,594,148 | B1 * | 7/2003 | Nguyen et al. | 361/695 |
| 6,819,563 | B1 * | 11/2004 | Chu et al. | 361/696 |
| 7,315,448 | B1 * | 1/2008 | Bash et al. | 361/701 |
| 7,349,213 | B2 * | 3/2008 | Campbell et al. | 361/699 |
| 7,385,810 | B2 * | 6/2008 | Chu et al. | 361/679.48 |
| 7,464,563 | B2 * | 12/2008 | Park et al. | 62/324.6 |

(Continued)

OTHER PUBLICATIONS

ASHRAE Transactions, "ASHRAE Research: Improving the Quality of Life", 2007 American Society of Heating, Refrigerating and Air-Conditioning Engineers, Inc. Atlanta, GA, vol. 113, Part 1, pp. 1-21.

(Continued)

*Primary Examiner* — Frantz Jules  
*Assistant Examiner* — Martha Tadesse  
(74) *Attorney, Agent, or Firm* — Thomas E. Tyson; Jeffrey L. Streets

(57) ABSTRACT

Embodiments of the present invention include a cooling system and method for cooling a computer rack by circulating liquid coolant through different sections of a rack heat exchanger under separately controlled flow and temperature conditions. In a method according to one embodiment, a first liquid coolant is supplied to a first section of an air-to-liquid heat exchanger. A second liquid coolant is supplied to a second section of the air-to-liquid heat exchanger at a different temperature than the first liquid coolant. Airflow is generated through rack-mounted computer components to the first and second sections of the air-to-liquid heat exchanger. The flow rates of the first and second liquid coolants are independently controlled to enforce a target cooling parameter. The independent operation of the first and second fin tube sections allows for the increased use of un-chilled water without sacrificing heat removal objectives.

23 Claims, 6 Drawing Sheets

(56) References Cited

U.S. PATENT DOCUMENTS

| | | | |
|---|---|---|---|
| 7,477,514 B2* | 1/2009 | Campbell et al. | 361/699 |
| 7,534,167 B2 | 5/2009 | Day | |
| 7,548,170 B1 | 6/2009 | Griffel et al. | |
| 7,703,296 B2* | 4/2010 | Jang et al. | 62/335 |
| 7,752,864 B2* | 7/2010 | Takegami et al. | 62/324.1 |
| 8,081,459 B2* | 12/2011 | Doll et al. | 361/696 |
| 8,297,069 B2* | 10/2012 | Novotny et al. | 62/259.2 |
| 2001/0042616 A1 | 11/2001 | Baer | |
| 2004/0099747 A1* | 5/2004 | Johnson et al. | 236/49.3 |
| 2004/0100770 A1* | 5/2004 | Chu et al. | 361/698 |
| 2006/0126293 A1* | 6/2006 | Campbell et al. | 361/699 |
| 2007/0283710 A1* | 12/2007 | Gilbert et al. | 62/259.2 |
| 2008/0198549 A1* | 8/2008 | Rasmussen et al. | 361/696 |
| 2009/0046423 A1 | 2/2009 | Hom et al. | |
| 2009/0126909 A1* | 5/2009 | Ellsworth et al. | 165/104.33 |
| 2009/0126910 A1* | 5/2009 | Campbell et al. | 165/104.33 |
| 2009/0225514 A1 | 9/2009 | Correa et al. | |
| 2009/0260384 A1* | 10/2009 | Champion et al. | 62/259.2 |
| 2009/0268404 A1 | 10/2009 | Chu et al. | |
| 2010/0078160 A1* | 4/2010 | Novotny et al. | 165/247 |
| 2010/0136895 A1* | 6/2010 | Sgro | 454/184 |
| 2011/0265983 A1* | 11/2011 | Pedersen | 165/279 |
| 2011/0271695 A1* | 11/2011 | Kashirajima et al. | 62/62 |

OTHER PUBLICATIONS

Ellsworth et al. "The Evolution of Water cooling for IBM large Server Systems: Back to the Future", IBM Corp., Poughkeepsie, NY, IEEE 2008, pp. 266-274.

IBM, "Appearance Solution for computer Server Rack Enclosure", IPCOM000183058D, May 13, 2009, 5 pages.

IBM, "Display to indicate rate of flow of coolant for a chiller door on a rack", IPCOM000166855D, Jan. 25, 2008, 3 pages.

Udakeri, "Comparison of Cooling Performace of Overhead and Underfloor Supply with Rear Door Heat Exchanger in High Density Data Center Clusters", UMI No. 1456592, Jul. 10, 2008, 58 pages.

Schmidt et al., "Maintaining Datacom RAck Inlet Air Temperatures with Water Cooled Heat Exchanger" IPACK2005-73468, Jul. 17-22, 2005, 14 pages.

* cited by examiner

COMPUTER RACK COOLING USING INDEPENDENTLY-CONTROLLED FLOW OF COOLANTS THROUGH A DUAL-SECTION HEAT EXCHANGER

BACKGROUND

1. Field of the Invention

The present invention relates to computer system cooling, particularly in the context of a rear-door heat exchanger.

2. Background of the Related Art

Computer systems use electrical energy and produce heat as a byproduct. Rack-based computer systems include many rack-mounted components in a high-density arrangement, which can produce a considerable amount of heat. Heat must be removed from the rack to control internal temperatures and to maintain system reliability, performance, and longevity. In a conventional rack-based computer system, rack-mounted fans move cool air through the rack to remove the heat and cool the components. The heated exhaust air is then transported to a computer-room air conditioner ("CRAC"), which cools the air before returning the cooled air to the data center. Energy efficiency in a datacenter dramatically affects the total cost of ownership of datacenter equipment.

A rear-door heat exchanger (RDHX) is a particular type of cooling system provided on a rack. An RDHX is mounted on the rear of the rack and provides an air-to-liquid heat exchanger that circulates coolant through a fin tube assembly. Airflow exiting the rack is passed through the RDHX, which transfers heat from the airflow to the fin tube assembly. The RDHX may be opened like a door to access the rear of the rack. RDHX systems have proven to be more efficient than conventional CRAC units at cooling rack-based computer systems. Some RDHX systems developed by IBM can remove one-hundred percent or more of the heat added by the computer system to the airflow through the rack, eliminating the need for a conventional CRAC.

BRIEF SUMMARY

One embodiment of the present invention provides a method, in which a first liquid coolant is supplied to a first section of an air-to-liquid heat exchanger, a second liquid coolant is supplied to a second section of the air-to-liquid heat exchanger at a lower temperature than the first liquid coolant. Airflow is generated through rack-mounted computer components and then in series through the first and second sections of the air-to-liquid heat exchanger. The flow rates of the first and second liquid coolants to the heat exchanger are independently controlled to enforce a target cooling parameter.

Another embodiment of the invention provides a cooling system for a computer rack. The cooling system includes an air-to-liquid heat exchanger hingedly coupled to the rear of a computer rack to contact air flowing through the rack. The heat exchanger includes a first fin tube section having a first group of cooling tubes and a second fin tube section having a second group of cooling tubes. The first and second fin tube sections each extend across the rear of the computer rack. The first and second groups of cooling tubes form independent flow loops enabling the use of the same or separate coolants.

DETAILED DESCRIPTION

Figure 1:
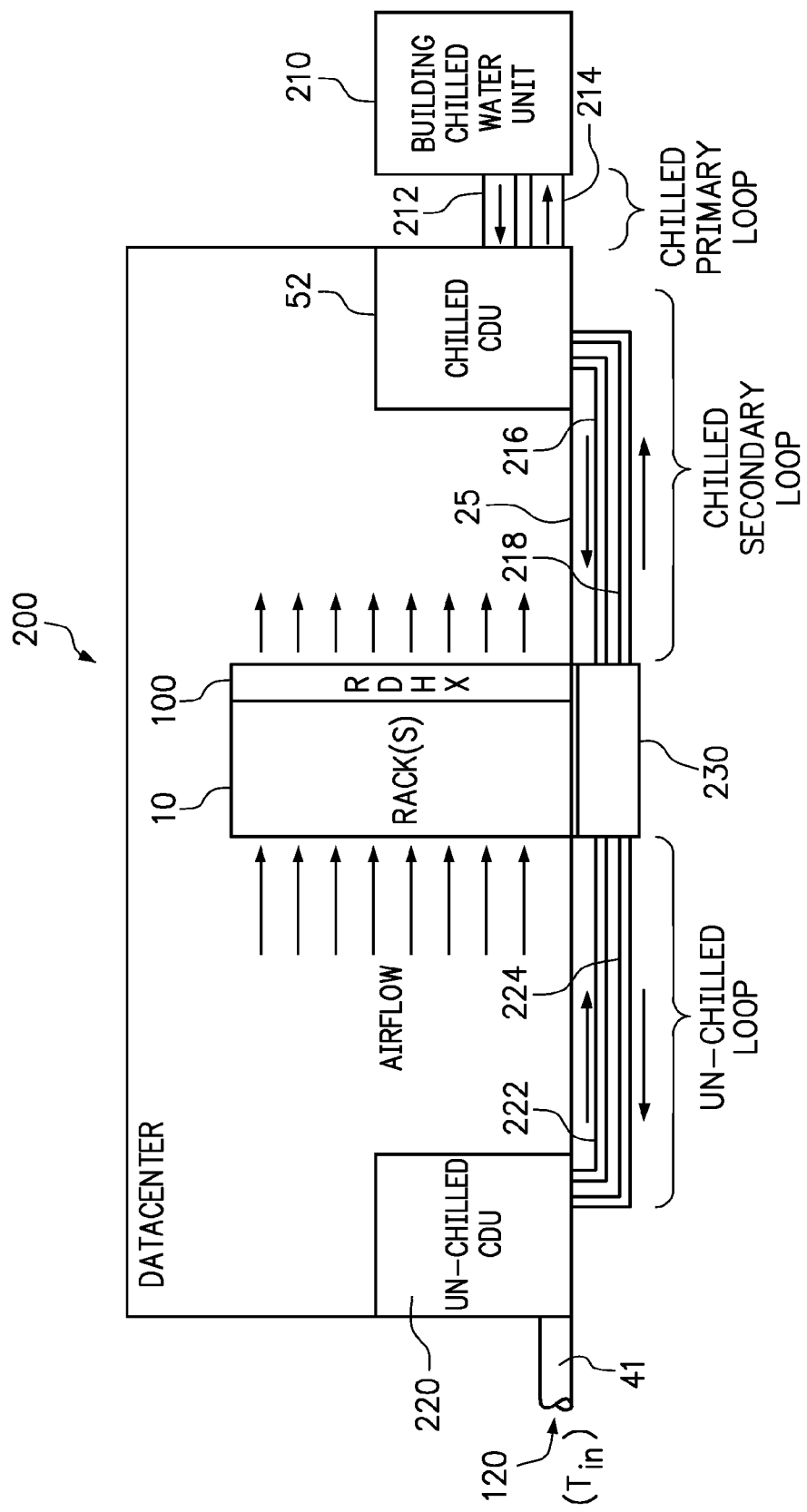
FIG. 1 is an elevation view of a data center configured to cool a plurality of computer racks using both chilled and un-chilled water.

Embodiments of the present invention include a cooling system and method for cooling a computer rack by circulating liquid coolant through different sections of a rack heat exchanger under separately controlled flow and temperature conditions. In one embodiment, a rear door heat exchanger includes two heat exchanger sections. Each section is supplied by a coolant from the same source or different sources, for example with one source providing chilled coolant and the other section providing un-chilled coolant. Each section may have one or more layers of cooling tubes. The cooling tubes in each section define a plurality of fluid circuits. Each circuit typically passes through multiple layers from an inlet manifold to an outlet manifold, making one or more passes across the heat exchanger within each layer. The flow rate of coolant to each section is individually controlled to enforce a target cooling parameter, such as a target exit air temperature of airflow exiting the rack or a target heat removal rate.

A variety of liquid coolants, such as water or refrigerant, may be used in the rear door heat exchanger. A different coolant may be run in each section. For example, chilled refrigerant may be used in one section, while un-chilled water may be used in another section. In some embodiments, un-chilled water may be used to provide "warm-water cooling" to remove at least some of the heat from airflow exiting a computer rack without the additional cost of chilling the water. When the un-chilled water is insufficient to achieve a cooling objective, another liquid coolant, such as chilled water or chilled refrigerant, may then be supplied to one or more heat exchanger section. Optionally, un-chilled water may be supplied to a first section and a minimum amount of chilled water (i.e., minimum flow rate and/or minimum temperature differential below the un-chilled water temperature) may be supplied to a second section to provide just enough cooling to enforce the target cooling parameter. The temperature of the un-chilled water will fall in response to falling ambient temperatures. As the temperature of the un-chilled water falls, the amount of chilled water circulated through the heat exchanger may be reduced, thus increasing the efficiency and lowering the operational cost of the datacenter. Occasionally, the temperature of the un-chilled water may be sufficiently low that the target heat removal rate may be achieved entirely using un-chilled water.

Although the present invention may be used with various coolants having the same or different flow rates and temperatures as described above, the following figures are described generally in terms of a first section of the heat exchanger circulating un-chilled water (the first coolant) and a second downstream section of the heat exchanger circulating chilled water (the second coolant). Additionally, though the cooling system and method are discussed primarily in the context of a rear-door heat exchanger (RDHX), racks having other types of heat exchangers are also within the scope of the invention.

FIG. 1 is an elevation view of a data center 200 configured, according to an embodiment of the invention, to cool a plurality of computer racks 10 using both chilled and un-chilled water. Each computer rack has an air-to-liquid rear-door heat exchanger ("RDHX") 100, which is further detailed in subsequent figures. A building chilled water unit 210 generates chilled water for use at a facility where the data center 200 is located. Some of the chilled water is provided to a chilled coolant distribution unit (CDU) 52 in a "chilled primary loop." The chilled primary loop includes a supply line 212 from the building chilled water unit 210 to the chilled CDU 52 and a return line 214 from the chilled CDU 52 to the building chilled water unit 210. The coolant being distributed in this embodiment is water, although other coolants may be used. The CDU 52 provides a "chilled secondary loop" of chilled water to one or more of the RDHXs 100 at a controlled flow rate and temperature. The chilled secondary loop is continually cooled by the chilled primary loop by means of an internal liquid-to-liquid heat exchanger (not shown). The chilled secondary loop includes, for each RDHX 100, one supply line 216 from the chilled CDU 52 to the RDHX 100 and one return line 218 from the RDHX 100 to the chilled CDU 52.

As generally understood in the art, the chilled CDU 52 typically has redundant pumps to pump water through the RDHXs 100 via the secondary loop. The flow rate of building chilled water flowing through the primary loop is adjustable so that the water supplied to the RDHX 100 in the secondary loop is chilled to the desired temperature. The temperature of the secondary loop is typically adjusted above the dew point to avoid condensation forming on the pipes. The chilled CDU 52 may include a manifold (not shown) which allows one chilled CDU 52 to deliver fluid to multiple RDHXs 100. Alternatively, such a manifold can be placed remote from the chilled CDU 52.

The chilled CDU 52 is optional, as chilled water from the building chilled water unit 210 could instead be supplied directly to the RDHXs 100. However, the chilled CDU 52 provides a number of useful functions and features. For example, the chilled CDU 52 can measure the dew point of the data center 200 and deliver water to the RDHXs 100 just above the dew point, to avoid condensation. The chilled CDU 52 also enables the use of a closed secondary loop, which contains a limited amount of water. Thus, in the event of a leak, only the limited amount of water contained in the secondary loop has the potential to leak out, rather than the essentially unlimited source of water from the building chilled water unit 210. Furthermore, the use of a separate secondary loop allows the water in the secondary loop to be treated specifically for use in the RDHXs 100, such as using additives to inhibit corrosion and biological growth.

Simultaneously, an un-chilled water source 120 is supplied to the RDHXs 100 in an un-chilled loop. Equipment for circulating un-chilled water to the RDHXs 100 is referred to here as an "un-chilled CDU" 220. The un-chilled CDU 220 may be a simplified version of the chilled CDU 52, or altogether different than the chilled CDU 52, since the un-chilled CDU 220 distributes only un-chilled water. For example, the un-chilled CDU 220 does not require a liquid-to-liquid heat exchanger. In one implementation, the un-chilled CDU 220 may simply include one or more valves for controlling the flow of un-chilled coolant to the RDHXs 100. However, like the chilled CDU 52, the un-chilled CDU 220 may also include redundant pumps and manifolds to circulate un-chilled water through multiple RDHXs 100. The un-chilled loop includes a supply line 222 from the un-chilled CDU 220 to each RDHX 100 and a return line 224 from each RDHX 100. The un-chilled loop is often not a closed loop. Rather, heated water exiting the RDHXs 100 on the return line 224 may be drained or supplied to a building heating or hot water system (not shown). The chilled and un-chilled water are circulated, without mixing, through separate flow passages or sections within the RDHXs 100, as further described below.

A water supply 41 supplies water to the un-chilled CDU 220. The water supply 41 may be exposed to ambient air, such that the temperature of the water in the water supply 41 varies with the ambient air temperature, and may be about equal to the temperature of the ambient air. Thus, the temperature of the chilled water from the chilled CDU 52 is typically lower than the un-chilled water from the un-chilled CDU 220. However, because the un-chilled water is typically affected by the temperature of ambient air, which may be outdoor air, it is possible for the un-chilled water to occasionally be at a lower temperature than the building chilled water unit 210 would ordinarily provide. Accordingly, the rates at which chilled and un-chilled water are separately circulated through the RDHXs 100 may be selected as a function of the temperature of the un-chilled water. For example, during the winter, the temperature of the un-chilled water may be low enough to cool the RDHXs 100 using little or no chilled water from the chilled CDU 52.

A flow control subsystem 230 is optionally included to provide additional control of the flow of chilled and un-chilled water to the RDHXs 100. The flow control subsystem is schematically shown as being provided under the racks 10 beneath a raised datacenter floor 25, remotely from the chilled CDU 52 and un-chilled CDU 220. However, one skilled in the art will appreciate that the flow control subsystem 230 may instead be functionally provided by equipment included with the chilled CDU 52, within the un-chilled CDU 220, or any other location. The flow control subsystem 230 controls the flow of chilled and un-chilled coolant to the RDHXs 100. The flow control subsystem 230 may include valves and other flow controls to control which pair of supply and return manifolds receives chilled water or un-chilled water. For example, the flow control subsystem 230 may include one or more three-port valves, as discussed below, to control whether a particular section of each RDHX 100 receives chilled water or un-chilled water.

Figure 2:
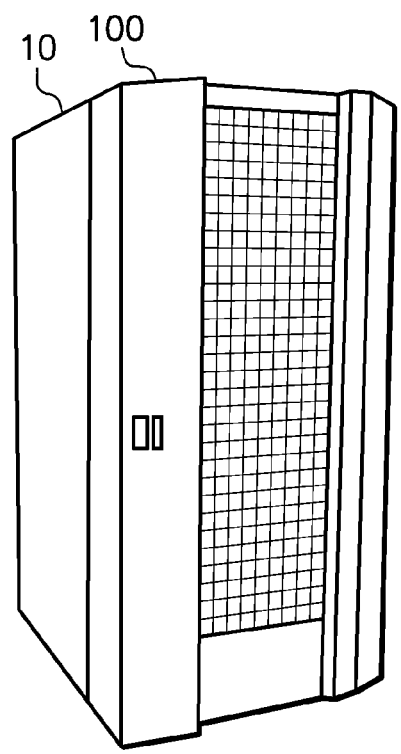
FIG. 2 is a rear perspective view of a computer rack with a rear door heat exchanger in a closed position.

FIG. 2 is a rear perspective view of one computer rack 10 with the RDHX 100 in a closed and operational position. Modular computer components, such as servers, network switches, and power distribution units (not shown) are mounted in each rack 10. On-board cooling fans or blower modules are used to drive airflow through the rack 10 from the front of the rack 10 to the rear of the rack and out through the RDHX 100. Heat is transferred from the rack-mounted components to the air flowing through the rack 10, which cools the rack-mounted components and correspondingly heats the airflow. The RDHX 100 removes at least some of the heat from the airflow, to reduce the load on a computer room air conditioner (CRAC) or to potentially eliminate the need for the CRAC.

Figure 3:
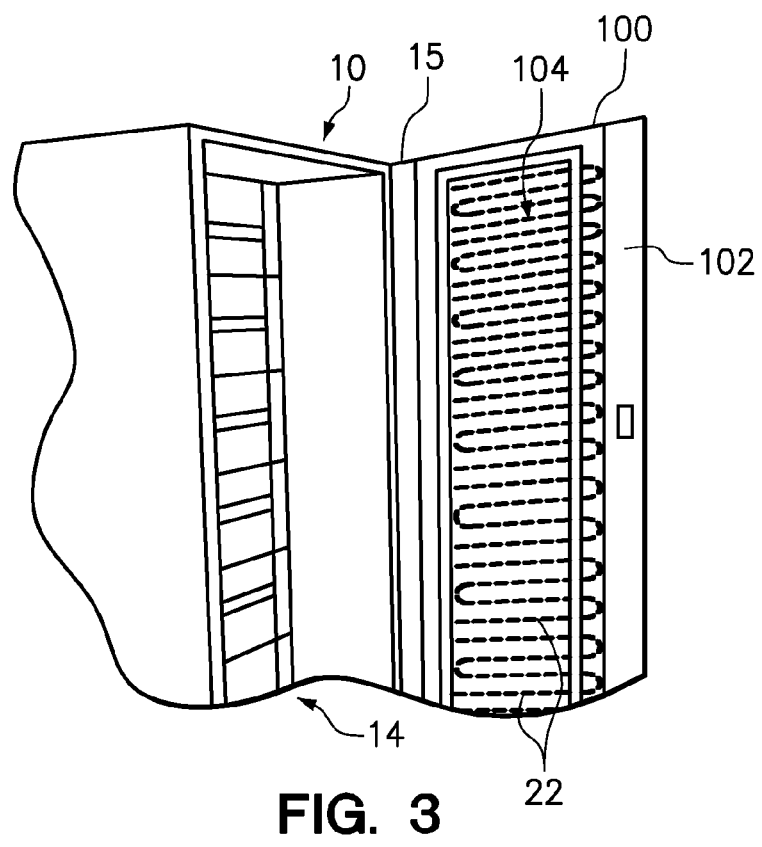
FIG. 3 is a rear perspective view of the computer rack of FIG. 2, with the rear door heat exchanger in an open position.

FIG. 3 is a rear perspective view of the computer rack 10 of FIG. 2, with the RDHX 100 in an open position. The RDHX 100 is pivotably supported on the rack 10 by a hinged edge 15, which may include an upper and lower hinge (not shown), allowing the RDHX 100 to pivotably open and close. The RDHX 100 is normally closed during operation of the computer components, as shown in FIG. 2, so that substantially all of the airflow through the rack 10 is constrained to pass through the rear-door heat exchanger 100. When necessary, the RDHX 100 can be opened as shown in FIG. 3 for access to the rack-mounted computer components from the rear 14 of the rack 10.

The RDHX 100 includes an internal fin tube assembly 104 supported inside a frame 102. As further detailed in FIGS. 4-6, the fin tube assembly 104 comprises cooling fins and cooling tubes in direct thermal contact with the cooling fins. A number of thin, closely-spaced cooling fins may be provided with the RDHX 100, aligned with the direction of airflow through the RDHX 100. Although it is not necessary for the fins to be flat, the fins in one embodiment may be considered to extend along a vertical plane that is also parallel to the direction of airflow through the rack. The cooling tubes 22 are arranged in multiple layers spanning the frame 102, such as between two to six layers deep from the front to the rear of the door. The cooling tubes 22 traverse the RDHX 100 in a serpentine fashion, passing horizontally back and forth across the RDHX 100 in thermal contact with the cooling fins. Each successive pass of a cooling tube 22 across the RDHX 100 may differ in location from the previous pass by moving up or down in the vertical direction or by moving horizontally toward the front or back of the door. For instance a given fluid circuit between an inlet and outlet manifold could be 4 layers deep and 3 rows in height, giving 12 passes (tubes) across the RDHX 100.

Figure 4:
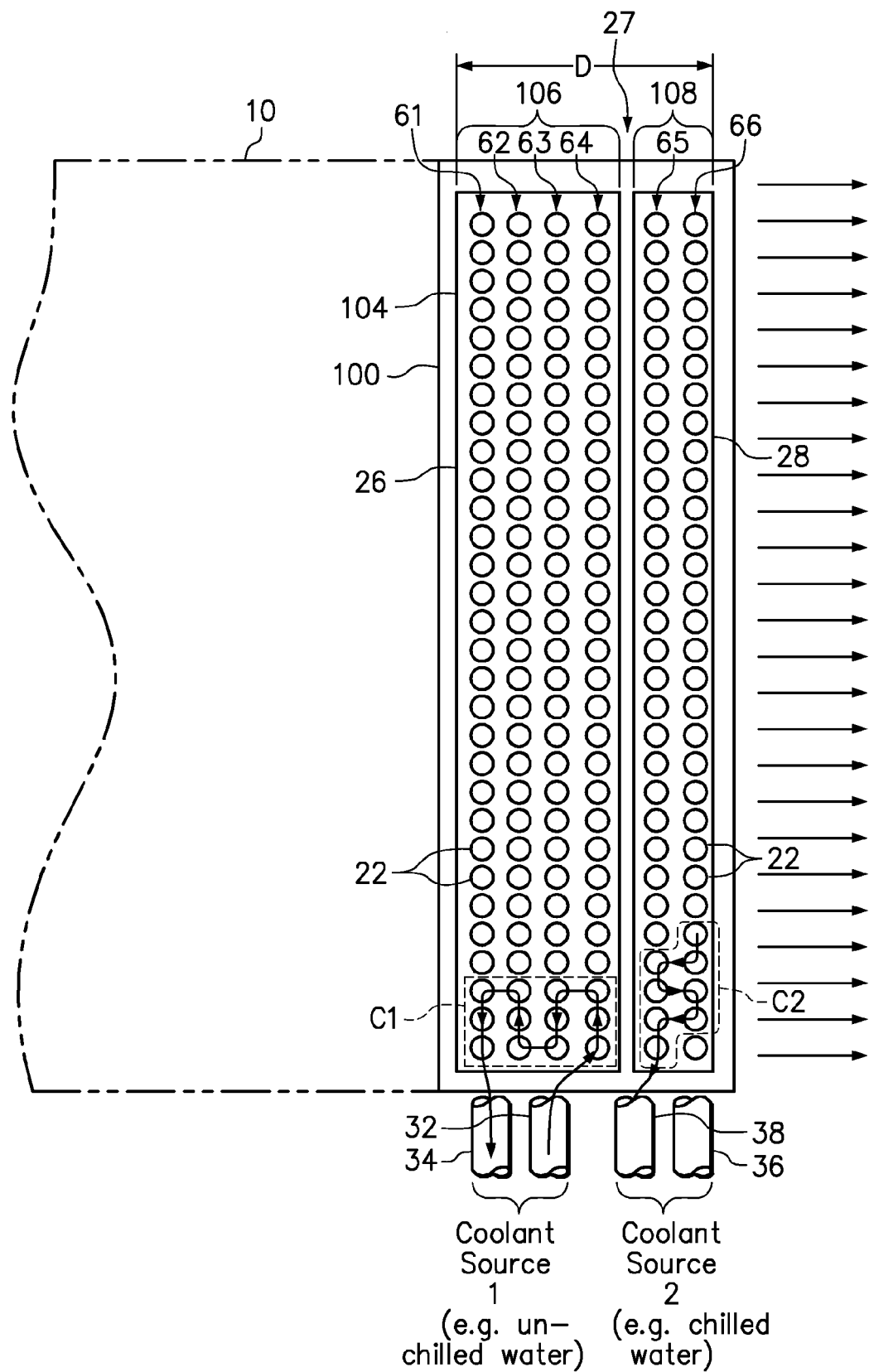
FIG. 4 is a cross-sectional side view of the rear door heat exchanger in a vertical (upright) position.

FIG. 4 is a cutaway side view of the RDHX in a vertical (upright) position. The fin tube assembly 104 contained within this embodiment of the RDHX 100 has a combined total of six vertical layers 61-66 of cooling tubes 22 among two fin tube sections 106, 108. The cooling tubes 22 are schematically shown here in circular cross-section. The number of cooling tube layers in each fin tube section 106, 108 can vary depending on the embodiment. A different number of cooling tube layers may be provided in each fin tube section. By way of example, the cooling tubes 22 in a first fin tube section 106 are four layers (61-64) deep, and the cooling tubes 22 in a second fin tube section 108 are two layers (65-66) deep. As a practical limitation, however, increasing the number of cooling tube layers will generally require a commensurate increase in depth "D" of the fin tube assembly 104.

The first fin tube section 106 has a first set of vertically oriented cooling fins 26. The second fin tube section 108 has a second set of vertically-oriented cooling fins 28. The cooling fins 26, 28 are spaced from each of the other fins within the same fin tube section (into the page in FIG. 4), and aligned with the direction of airflow. The cooling tubes 22 pass back and forth across the RDHX 100, i.e. into and out of the page in FIG. 4. The cooling tubes 22 pass through the cooling fins 26, 28 in direct thermal contact with the cooling fins 26, 28. The first set of cooling fins 26 is optionally separated from the second set of cooling fins 28 by an air gap 27, as shown, to prevent heat conduction directly from the first set of cooling fins 26 to the second set of cooling fins 28. Alternatively, a single set of continuous cooling fins each spanning both fin tube sections 106, 108 could be used in lieu of two separate sets of cooling fins separated by an air gap. Continuous cooling fins spanning both fin tube sections 106, 108 may be easier and less costly to manufacture, and enhance the structural integrity of the fin tube assembly. Thus, the option to provide a separate set of cooling fins to multiple sections of a heat exchanger may be determined according to the particular embodiment of the invention.

The first fin tube section 106 is supplied with coolant from a first coolant source. The second fin tube section 108 is supplied with coolant from a second coolant source. A first coolant inlet manifold 32 supplies a controlled amount of coolant from the first coolant source to the cooling tubes 22 in the first fin tube section 106. The first coolant inlet manifold 32 extends vertically, running the height of the RDHX 100, with multiple fluid circuits branching out from various vertical positions along the manifold. However, a portion of the first coolant inlet manifold 32 above a lower edge of the RDHX 100 is removed from view in FIG. 4, to reveal certain details of the RDHX 100. The coolant circulating through the first fin tube section 106 is discharged to a first coolant outlet manifold 34. A second coolant inlet manifold 36 supplies a controlled amount of coolant from the second coolant source to the cooling tubes 22 in the second fin tube section 108 of the fin tube assembly. The coolant circulating through the second fin tube section 108 is discharged to a second coolant outlet manifold 38. Portions of the manifolds 32, 34, 36, 38 are also removed from view in FIG. 4 for clarity. The manifolds 32, 34, 36, 38 are arranged side-by-side in FIG. 4, for ease of illustration. However, the diameter of the manifolds 32, 34, 36, 38 may be significantly larger than the diameter of the cooling tubes. Thus, the manifolds may alternatively be placed at opposite ends, for more efficient use of space. For example the two inlet manifolds 32, 36 may both be positioned on one side (e.g. on the left side) of the RDHX 100 and the two outlet manifolds 34, 38 may be positioned on the other (e.g. right) side.

In one example mode of operation, un-chilled water (e.g. from the un-chilled CDU 220 of FIG. 1) may be circulated through the first fin tube section 106 and chilled water (e.g. from the chilled CDU 52 of FIG. 1) may be circulated through the second fin tube section 108. Airflow exiting the rack 10 first passes through the first fin tube section 106 before passing through the second fin tube section 108. Thus, in this example mode of operation, the heated airflow from the rack 10 will first be cooled by the first fin tube section 106, using un-chilled coolant, before being further cooled by the second fin tube section 108 using chilled coolant. Thus, the use of chilled coolant in the downstream, second fin tube section 108 allows the most heat to be rejected to the un-chilled water and minimizes the amount of chilled water required to achieve the target cooling parameters. This is also desirable if the flow of warm water exiting the RDHX 100 is to be reused for subsequent heating elsewhere in the building.

The cooling tubes 22 define multiple fluid circuits through the RDHX 100 passing coolant from the first coolant inlet manifold 32 to the first coolant outlet manifold 34 and from the second coolant inlet manifold 36 to the second coolant outlet manifold 38. A myriad of different fluid circuits and cooling tube arrangements may be selected for use with the fin tube assembly. One example circuit is outlined at C1. The circuit C1 is four layers deep and three rows high in the first fin tube section 106. The circuit C1 is arranged in a counter-current or quasi-countercurrent manner, wherein the coolant flow progresses through the layers 61-64 in a direction opposite the airflow. Coolant in circuit C1 is progressively heated as coolant flows from layer 64 to layer 61, and the airflow through the first section 106 is progressively cooled as it passes through layer 61 to layer 64. This counter flow arrangement enhances the heat transfer between the air and water. Another example fluid circuit is outlined at C2. The fluid circuit C2 is two layers deep and four rows high in the second fin tube section 108.

Figure 5:
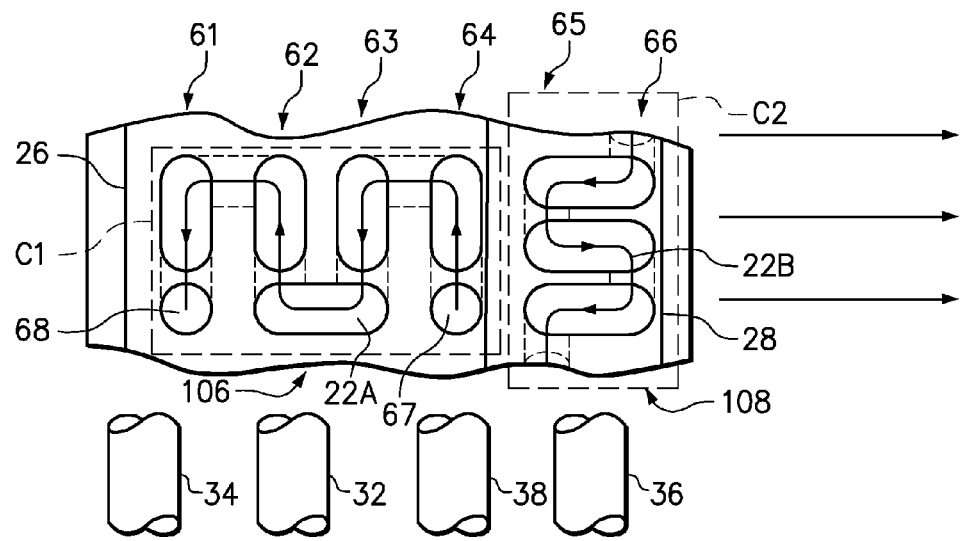
FIG. 5 is a side view of a portion of the fin tube assembly of FIG. 4 further detailing some example fluid circuits.

FIG. 5 is a side view of a portion of the fin tube assembly 104 of FIG. 4 further detailing the example fluid circuits C1 and C2. The circuit C1 begins at an inlet node 67 from the first coolant inlet manifold 32, following a serpentine path back and forth across the RDHX (into and out of the page) to an outlet node 68 at the first coolant outlet manifold 34. FIG. 5 shows that circuit C1 makes three alternating passes across the RDHX 100 within each of layers 64, 63, 62, and 61, for a total of twelve passes across the RDHX. Circuit C2 sequentially makes two passes across the RDHX in layer 65, followed by two passes in layer 66, and two more passes in layers 65 and two more passes in layer 66, for a total of eight passes across the RDHX.

Figure 6:
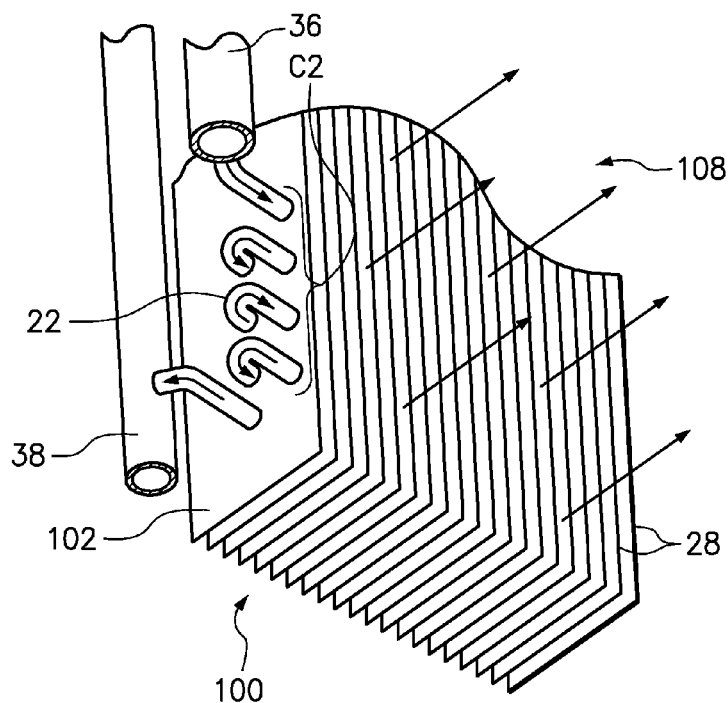
FIG. 6 is a perspective, partial cutaway view of a portion of the fin tube assembly, further detailing one of the fin tube sections.

FIG. 6 is a perspective cutaway view of the fin tube assembly detailing, by way of example, a selected portion of the second fin tube section 108. The cooling fins 28 are arranged in parallel, oriented in the direction of the airflow. The cooling tube 22 passes orthogonally through the cooling fins 28 as it passes back and forth across the RDHX. The cooling tube 22 is in direct thermal contact with the cooling fins 28, to transfer heat from the cooling fins 28 to the cooling tube 22 and the coolant flowing through the cooling tube 22. The cooling fins 28 are typically very thin, such as on the order of about 0.0055" thick, with a large surface area exposed to the airflow for effective heat transfer. Many different shapes or configurations are possible for the cooling fins 28. Typically, the cooling fins 28 are corrugated or perforated to increase surface area and to increase turbulence within the cooling fins 28.

Figure 7:
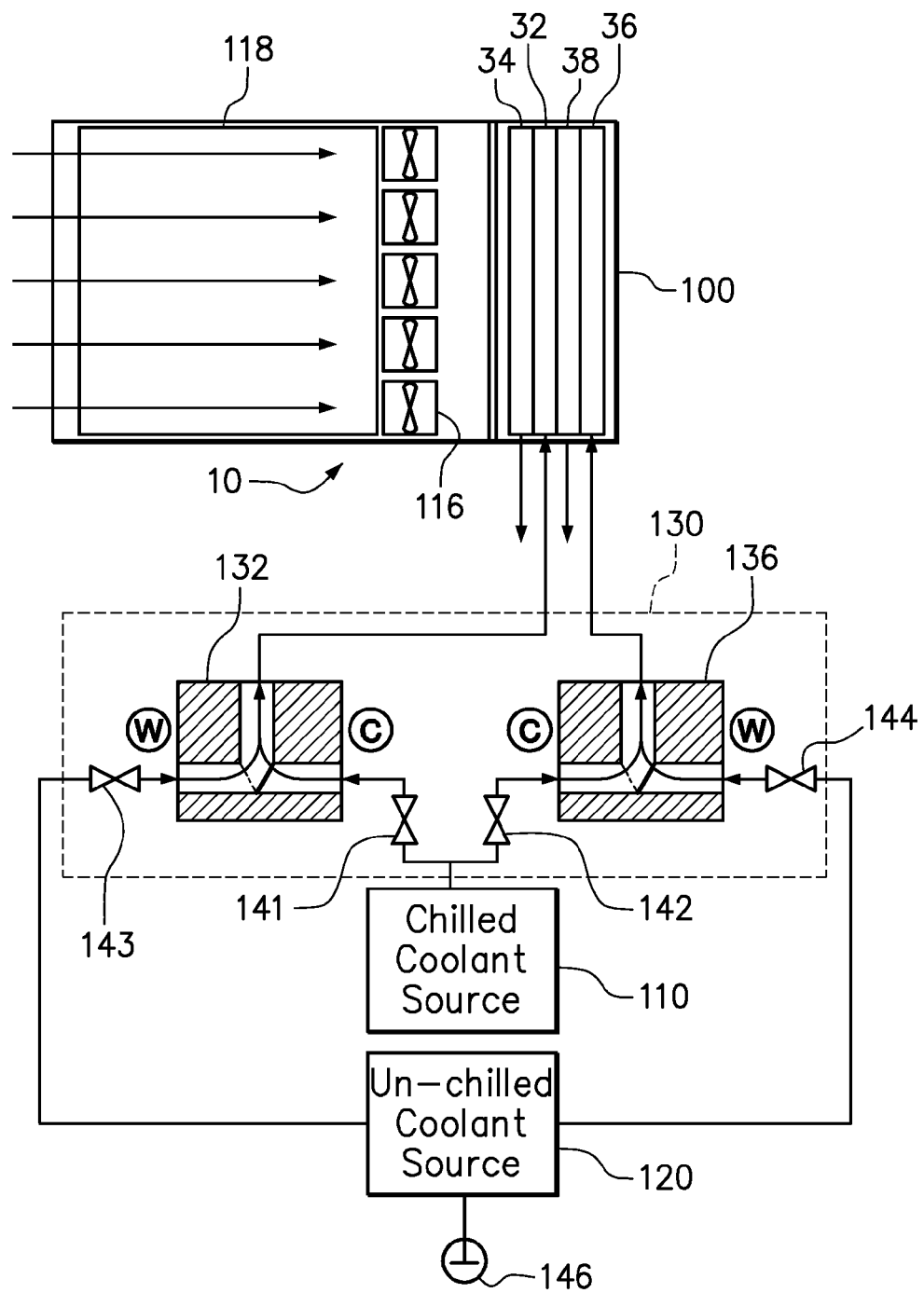
FIG. 7 is a schematic diagram illustrating flow control for the chilled and un-chilled water through a rear door heat exchanger.

FIG. 7 is a schematic diagram illustrating flow control for the chilled and un-chilled water through a rear door heat exchanger, as discussed by way of example in the context of the rack 10 and RDHX 100 discussed above. The rack 10 and included RDHX 100 are shown in plan view. Cooling fans 116 are used to generate airflow through the rack 10. Rack-mounted components 118 generate heat, which is transferred to the airflow. A chilled coolant source 110 provides chilled coolant to the RDHX 100. An un-chilled coolant source 120 provides un-chilled coolant to the RDHX 100. The chilled coolant source may be, for example, chilled water from the chilled CDU 52 of FIG. 1. The un-chilled coolant source 120 may be, for example, un-chilled water from the un-chilled CDU 220 of FIG. 1. The coolant manifolds 32, 34, 36, 38 circulate chilled and un-chilled coolant to the cooling tubes that pass back and forth across the RDHX 100, as described above. A flow control system 130 controls the flow to the RDHX 100 of chilled coolant from the chilled coolant source 110 and un-chilled coolant from an un-chilled coolant source 120. The flow control system 130 may be used to provide a controlled, variable amount of chilled coolant and un-chilled coolant to the RDHX 100, and to control which of the coolant inlet manifolds 32, 36 receive the chilled or un-chilled coolant. The flow control system 130 may be comprised of conventional flow control equipment, such as valves, pumps, and electronic or electro-mechanical controllers comprising flow control logic for operating mechanical components of the flow control system 130. The flow control equipment may collectively include equipment provided with any of the chilled CDU 52, the un-chilled CDU 220, or the optional flow control subsystem 230 of FIG. 1.

The equipment for selectively supplying coolant from either the chilled coolant source 110 or the un-chilled coolant source 120 to the first inlet manifold 32 is schematically represented by a first three-port valve 132. The equipment for selectively supplying coolant from either the chilled coolant source 110 or the un-chilled coolant source 120 to the second inlet manifold 36 is schematically represented by a second three-port valve 136. One skilled in the art will appreciate that the flow control schematically represented as three-port valves 132, 136 may be implemented in a multitude of different ways. The first three-port valve 132 is in fluid communication with the chilled coolant source 110 providing chilled water (denoted "C" for cold) and with the un-chilled coolant source 120 providing un-chilled water (denoted "W" for warm). The valve 132 can direct either the chilled water or un-chilled water to the first coolant inlet manifold 32. Likewise, the valve 136 can provide either chilled water or un-chilled water to the second coolant inlet manifold 136. The flow control system 130 can also vary the flow rate of chilled or un-chilled coolant to each of the manifolds 32, 36, such as using the redundant pumps included with either of the CDUs 52, 220 of FIG. 1.

According to one aspect of this embodiment, a target cooling parameter may be enforced by controlling which (if any) of the inlet manifolds 32, 36 receive chilled coolant and which (if any) of the inlet manifolds 32, 36 receive un-chilled coolant. This is in addition to the functionality of controlling the flow rates of chilled and/or un-chilled coolant to the inlet manifolds 32, 36. In FIG. 7, the three-port valve 132 allows un-chilled coolant to flow to the first inlet manifold 32 while the second three-port valve 136 allows chilled coolant to the second inlet manifold 36. This is the mode described in FIG. 4, for example, where the airflow exiting the rack 10 passes through the first fin tube section 106 cooled by un-chilled coolant before passing through the second fin tube section 108 cooled by chilled coolant. While in this mode, the flow rate of un-chilled coolant to the first inlet manifold 32 may be controlled, such as using a pump of the un-chilled CDU 220 of FIG. 1. The flow rate of chilled coolant to the second inlet manifold 36 may also be controlled, such as using a pump of the chilled CDU 52 of FIG. 1. Note that various additional valves 141, 142, 143, 144 may be included for selectively restricting or shutting off flow from the coolant sources 110, 120 to the valves 132, 136 and the downstream RDHX 100. However, for the purpose of adjusting flow rate to achieve the target heat removal rate, it is generally more efficient to control flow from the coolant sources 110, 120 by adjusting the speed of pumps.

In some cases, assuming the chilled coolant is at a lower temperature than un-chilled coolant, the three-port valves 132, 136 may be temporarily operated to run chilled coolant through both sections 106, 108 to maximize cooling. In other cases, such as when the temperature of the un-chilled coolant has fallen to less than the temperature of chilled coolant that the chilled CDU 52 would ordinarily provide, the three-port valves 132, 136 may be temporarily operated to allow un-chilled coolant to flow to both sections 106, 108.

The target heat removal rate may be expressed, for example, as a percentage of the amount of heat transferred to the airflow from the rack mounted components. Typically, the target heat removal rate may be at least 60%. The target heat removal rate could also be expressed as a range, such as between 60-90% heat removal. In some cases, the flow of coolant may be controlled to remove more heat than was transferred to the airflow from the rack-mounted components, i.e. greater than 100% heat removal. A heat removal rate of about 100% provides a datacenter-level of cooling that may eliminated the need for a separate computer room air conditioner (CRAC). A heat removal rate of greater than 100% provides a cooling overcapacity or redundancy. For example, the rack 10 with an RDHX 100 providing greater than 100% heat removal may be used to cool both the rack 10 and an adjacent rack (not shown) that doesn't have an RDHX.

The heat removal rate provided by the RDHX 100 depends, in part, on both the temperatures of the chilled water and the un-chilled water and the flow rates at which the chilled water and un-chilled water are circulated through the RDHX 100. As mentioned above in the discussion of FIG. 1, the temperature of the chilled water is typically maintained at least slightly above the dew point in the data center by a chilled CDU. In that case, the temperature of the chilled water will be known. The temperature of the un-chilled water may vary, however, such as with daily and seasonal fluctuations in outdoor air or soil temperatures. Thus, the temperature of the un-chilled water may be continuously monitored as one variable that affects heat removal using the RDHX 100 when un-chilled water is being circulated through the RDHX 100. In the example embodiment of FIG. 7, a temperature sensor 146 at the un-chilled coolant source is used to monitor the temperature of the un-chilled water being delivered to the RDHX 100. Although the temperature of the un-chilled water is generally well above the dew point within the datacenter, the temperature of the un-chilled water must be monitored to ensure that water at temperatures below the dew point is not allowed to flow to the heat exchanger. The output signal of the temperature sensor 146 is communicated to one or more controller for use in controlling the cooling system.

The flow rate of one or both of the chilled water and the un-chilled water may be independently adjusted to achieve the target cooling parameter. Furthermore, the flow rate of chilled and/or un-chilled water may be independently controlled for each RDHX. In the example embodiment of FIG. 1, for example, the chilled CDU 52 of FIG. 1 may adjust the flow rate of chilled water circulating through each RDHX 100, such as by adjusting the speed of a pump used to circulate the chilled water to each RDHX 100 or further opening a valve controlling the flow to each RDHX. The un-chilled CDU 220 may likewise adjust the flow rate of un-chilled water circulating through each RDHX 100. The chilled CDU 52 may dynamically adjust the flow rate of the chilled water to provide the minimum volumetric flow rate of chilled water necessary to achieve the target cooling parameter.

Daily and seasonal fluctuations in the outdoor air or soil temperatures may affect the temperature $T_{in}$ of the un-chilled water source 120. For example, when the outdoor air temperature decreases from afternoon to late evening, or from Summer to Fall or Winter months, the un-chilled water may be naturally cooled by a corresponding amount. The flow rates of chilled and un-chilled water circulated through the RDHX 100 may be automatically adjusted in response to the temperature $T_{in}$. As the temperature $T_{in}$ of the un-chilled water decreases, the temperature differential between the un-chilled water and the airflow through the RDHX 100 will increase, so that the un-chilled water more effectively removes heat from the rack 10. Thus, the chilled CDU 52 may respond to a decrease in the temperature of the un-chilled water by decreasing the flow of chilled water through the RDHX 100, and optionally increasing the flow of un-chilled water through the RDHX 100.

It should be recognized that the rate at which heat is generated by the components in the computer rack may vary over time with changes in the load placed on those components during normal operation. The amount of heat that needs to be removed to achieve a target heat removal rate when expressed as a percentage of the heat added to the airflow by a computer in the rack 10, depends on the magnitude of the heat generated by the computer in the rack 10. Thus, as the rate of heat generation by the computer increases, the flow rate of one or both of the chilled coolant and un-chilled coolant may need to be increased accordingly, and/or the temperature of the chilled coolant reduced, to achieve the target heat removal rate.

In some cases, the temperature of the un-chilled water will be sufficiently low that the chilled CDU 52 need not supply any chilled water to the RDHX 100. In that case, the chilled CDU 52 may be powered down to reduce energy consumption, and the RDHX 100 may be cooled entirely by the flow of un-chilled water. When the temperature $T_{in}$ of the un-chilled water subsequently increases, the chilled CDU 52 may be automatically powered back on or the flow rate of chilled water from the chilled CDU 52 may be increased by an amount calculated to enforce the target cooling parameter.

Figure 8:
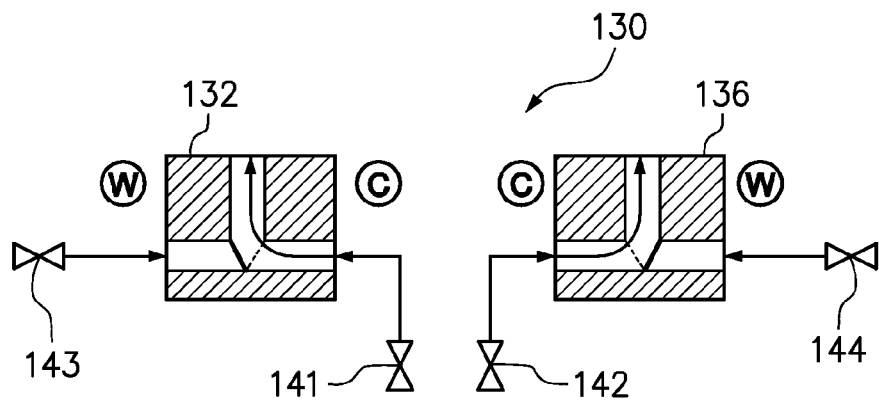
FIG. 8 is a schematic diagram of the flow control system wherein chilled water is delivered to both the first and second fin tube sections.

FIG. 8 is a schematic diagram of the flow control system 130 wherein the valves 132 and 136 are operated to deliver chilled coolant to both the first and second sections 106, 108 of FIG. 4, respectively. This may be desirable, for example, in instances when a computer system in the rack 10 is consuming power at an unusually high rate and producing an unusually large amount of heat (i.e. greater than a heat setpoint), or when the temperature $T_{in}$ of the un-chilled water is unusually warm (i.e. greater than a water temperature setpoint).

Figure 9:
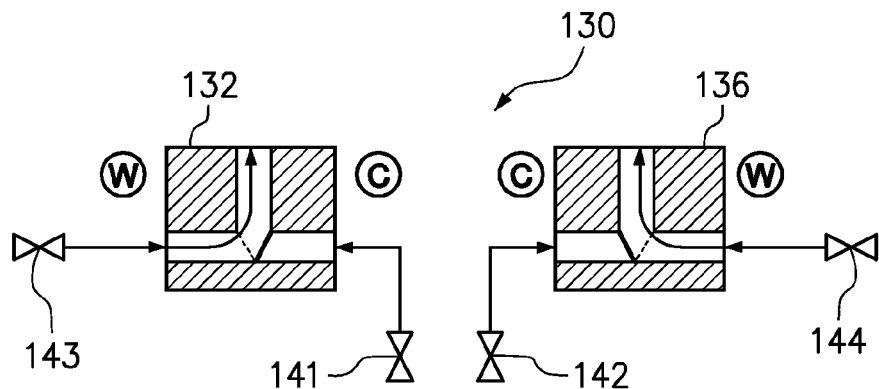
FIG. 9 is a schematic diagram of the flow control system wherein un-chilled water is circulated through both the first and second fin tube sections.

In other instances, the target heat removal rate may be achieved using entirely un-chilled water. For example, the power consumption and corresponding heat generation of a computer mounted on the rack 10 may be sufficiently low (i.e. less than a heat setpoint) or the un-chilled water may be sufficiently cool (i.e. less than a water temperature setpoint) that the RDHX 100 may be cooled entirely using un-chilled water. FIG. 9 is a schematic diagram of the flow control system 130 wherein the three-port valves 132 and 136 are operated to circulate un-chilled water through both the first and second sections 106, 108 of FIG. 4, respectively. When a chilled CDU is included, such as the chilled CDU 52 in FIG. 1, it is typically more efficient to shut off the pump of the chilled CDU 52 than to simply close a valve, because the pump consumes energy. In another embodiment, wherein chilled water is supplied directly to the RDHX 100 from a building chilled water unit 210 without an intervening chilled CDU 52, closing a valve to shut off the flow of chilled water to the RDHX 100 may be acceptable.

Figure 10:
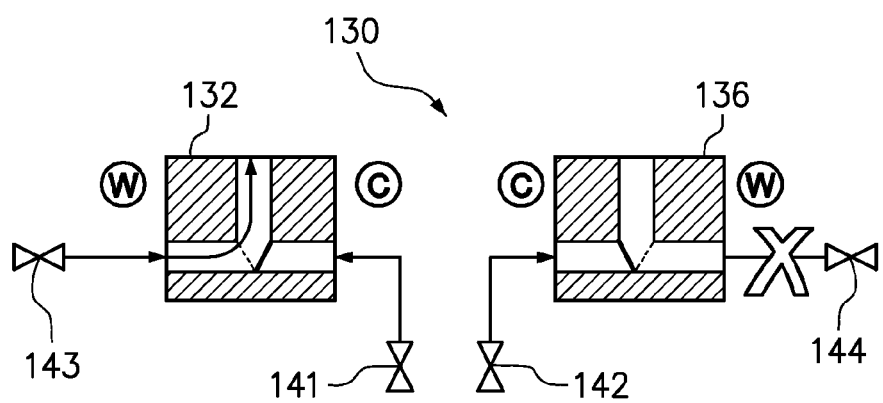
FIG. 10 is a schematic diagram of the flow control system wherein un-chilled water is circulated through only one of the fin tube sections.

In some instances, the target heat removal rate might even be achieved by circulating un-chilled water through only one fin tube section, and not circulating any water through the other fin tube section. FIG. 10 is a schematic diagram of the flow control system 130 wherein un-chilled water is circulated through only the first section 106 of FIG. 4. The valve 144 is closed (indicated by an "X") to completely shut off the flow of un-chilled water to the second coolant inlet manifold 36. Even when only un-chilled water is being circulated, such as in FIGS. 9 and 10, the temperature $T_{in}$ of the un-chilled water may be continuously monitored and the flow rate of the un-chilled water through the RDHX 100 dynamically adjusted to achieve the target cooling parameter.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally,"

"may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
    generating airflow through rack-mounted computer components and then in series through first and second sections of an air-to-liquid heat exchanger;
    independently controlling the flow rate of a first liquid coolant to the first section of the air-to-liquid heat exchanges and the flow rate of a second liquid coolant to the second section of the air-to-liquid heat exchanger to enforce a target cooling parameter in response to the heat generated in the rack being less than a heat setpoint or the temperature of the first liquid coolant being less than a temperature setpoint, wherein the second liquid coolant has a lower temperature than the first liquid coolant; and
    supplying the second liquid coolant to both the first and second sections of the air-to-liquid heat exchanger in response to the heat generated in the rack being greater than a heat setpoint or the temperature of the first liquid coolant being greater than a temperature setpoint.

2. The method of claim 1, wherein the airflow passes through the first section and then the second section.

3. The method of claim 1, further comprising:
    chilling the second liquid coolant while allowing the temperature of the first liquid coolant to vary with exposure to ambient temperature over a range of ambient temperatures of greater than the temperature of the chilled second liquid coolant.

4. The method of claim 3, further comprising:
    shutting off flow of the second liquid coolant to the air-to-liquid heat exchanger when the flow of the first liquid coolant is sufficient to achieve the target cooling parameter.

5. The method of claim 4, further comprising:
    supplying the first liquid coolant to both the first and second sections of the air-to-liquid heat exchanger.

6. The method of claim 1, further comprising:
    shutting off flow of the second liquid coolant to the air-to-liquid heat exchanger in response to determining that heat generated in the rack is less than a heat setpoint or in response to the temperature of the first liquid coolant being below a temperature setpoint.

7. The method of claim 1, wherein the target cooling parameter comprises a target heat removal rate.

8. The method of claim 7, wherein the target heat removal rate is between 60% and 90%.

9. The method of claim 1, wherein the target cooling parameter comprises a target temperature of the airflow exiting through the air-to-liquid heat exchanger.

10. The method of claim 1, further comprising:
    passing the first liquid coolant exiting the air-to-liquid heat exchanger to a building heating system.

11. The method of claim 1, wherein the first and second liquid coolants comprise water or refrigerant.

12. The method of claim 1, wherein the first liquid coolant is un-chilled water in thermal equilibrium with ambient air temperature.

13. The method of claim 1, wherein the second liquid coolant has a lower temperature than the first liquid coolant.

14. A cooling system for a computer rack, comprising:
    an air-to-liquid heat exchanger hingedly coupled to the rear of a computer rack to contact air flowing through the rack, the heat exchanger including a first fin tube section having a first group of cooling tubes and a second fin tube section having a second group of cooling tubes, wherein the first and second fin tube sections each extend across the rear of the computer rack, and wherein the first and second groups of cooling tubes form independent flow loops enabling the use of the same or separate coolants, and wherein the first and second fin tube sections are thermally isolated from each other.

15. The cooling system of claim 14, further comprising:
    a set of continuous cooling fins that span both fin tube sections.

16. The cooling system of claim 14, wherein the first and second fin tube sections are thermally isolated from each other by airspace or insulative element disposed there between.

17. A cooling system for a computer rack, comprising:
    an air-to-liquid heat exchanger coupled to the computer rack, the heat exchanger including a first fin tube section having a first group of cooling tubes and a second fin tube section having a second group of cooling tubes, wherein the first and second fin tube sections are thermally isolated from each other;
    an un-chilled liquid coolant supply fluidically coupled to the first group of cooling tubes;
    a chilled liquid coolant supply fluidically coupled to the second group of cooling tubes;
    an air mover for generating airflow through the computer rack and through the first and second fin tube sections of the heat exchanger; and
    a flow control system for controlling the flow of un-chilled liquid coolant to the first group of cooling tubes independently of the flow of chilled liquid coolant to the second group of cooling tubes.

18. The cooling system of claim 17, wherein the first fin tube section comprises a first plurality of cooling fins and the second fin tube section comprises a second plurality of cooling fins with an air gap between the first and second plurality of cooling fins.

19. The cooling system of claim 17, wherein the first group of cooling tubes comprises a first plurality of cooling tube layers laterally spaced in a direction of the airflow and the second group of cooling tubes comprises a second plurality of cooling tube layers laterally spaced in a direction of the airflow.

20. The cooling system of claim 17, further comprising:
    a chiller for chilling the chilled liquid coolant supply to a temperature of less than the un-chilled liquid coolant supply.

21. The cooling system of claim 17, wherein the flow control system comprises control equipment for selectively directing chilled liquid coolant instead of un-chilled liquid coolant to the first group of cooling tubes in response to reaching a setpoint.

22. The cooling system of claim 17, wherein the flow control system comprises control equipment for selectively directing the un-chilled liquid coolant instead of the chilled liquid coolant to the second group of cooling tubes in response to reaching a setpoint.

23. The cooling system of claim 17, wherein the flow control system comprises control equipment for selectively shutting off flow of the chilled liquid coolant to the second group of cooling tubes in response to the flow of the un-chilled liquid coolant to the first group of cooling tubes being sufficient to achieve a target cooling parameter.

* * * * *